United States Patent [19]
Lin et al.

[11] Patent Number: 5,827,768
[45] Date of Patent: Oct. 27, 1998

[54] METHOD FOR MANUFACTURING AN MOS TRANSISTOR HAVING A SELF-ALIGNED AND PLANARIZED RAISED SOURCE/DRAIN STRUCTURE

[75] Inventors: Horng-Chih Lin; Tiao-yuan Huang, both of Hsinchu, Taiwan

[73] Assignee: National Science Council, Taipei, Taiwan

[21] Appl. No.: 888,765

[22] Filed: Jul. 7, 1997

[51] Int. Cl.⁶ .................................................. H01L 21/336
[52] U.S. Cl. ........................... 438/300; 438/692; 438/564
[58] Field of Search .................................. 438/300, 303, 438/564, 691–693

[56] References Cited

U.S. PATENT DOCUMENTS

| | | |
|---|---|---|
| 4,789,644 | 12/1988 | Meda ....................................... 438/300 |
| 5,079,180 | 1/1992 | Rodder et al. . |
| 5,118,639 | 6/1992 | Roth et al. . |
| 5,198,378 | 3/1993 | Rodder et al. ........................... 438/300 |
| 5,268,330 | 12/1993 | Givens et al. ........................... 438/592 |
| 5,312,768 | 5/1994 | Gonzalez ................................. 438/300 |
| 5,409,853 | 4/1995 | Yu ........................................... 438/300 |
| 5,496,750 | 3/1996 | Moslehi .................................. 438/300 |
| 5,683,924 | 11/1997 | Chan et al. ............................. 438/300 |
| 5,736,419 | 4/1998 | Naem . |

*Primary Examiner*—Richard A. Booth
*Attorney, Agent, or Firm*—Merchant, Gould, Smith, Edell, Welter and Schmidt

[57] ABSTRACT

A new method for manufacturing an MOS transistor is applied in the deep submicron process. In this method, a polysilicon layer is mainly used to form a raised source/drain structure and self-alignment is achieved by means of a planarization process. This method can reduce short channel effects and the series impedance of the source/drain as well as accomplish the local interconnection of a circuit and planarization. Therefore, this method is very suitable for manufacturing devices in the deep submicron process.

4 Claims, 3 Drawing Sheets

5,827,768

METHOD FOR MANUFACTURING AN MOS TRANSISTOR HAVING A SELF-ALIGNED AND PLANARIZED RAISED SOURCE/DRAIN STRUCTURE

BACKGROUND OF THE INVENTION

1. Field of the Invention

The invention relates to a semiconductor process, and more particularly to a method for manufacturing an MOS transistor having a self-aligned and planarized raised source/drain structure 2. Description of the Related Art When the MOS transistor manufacturing has been entering into the submicron process, even into the deep submicron process (less than 0.25 micron), a short channel effect (SCE) caused by the short channel length of an MOS transistor is urgently demanded to be overcome.

Currently, a shallow junction technique for source/drain region is widely adopted to decrease the short channel effects of an MOS transistor in the semiconductor industry, wherein an extension source/drain structure is developed by the shallow junction technique as shown in FIG. 1A. However, the shallow junction can increase the impedance of the source/drain resulting in affecting the characteristics of devices. In order to decrease the impedance of the source/drain, increasing the amount of dopant in the shallow junction region is the only way, such that a great amount of dopant exists in an extremely shallow level of the shallow junction (less than 100 nm). In practice, to achieve the doped shallow junction having a high concentration by use of a conventional ion implantation process, and in particular of a $P^+/N^+$ junction process is really difficult.

For resolving the above-mentioned problem, several new shallow junction techniques had been disclosed, wherein a raised source/drain structure formed in the deep submicron process is considered having a preferable potential to achieve better characteristics, because the raised source/drain structure can obtain an extremely shallow junction and maintain very low impedance of the source/drain. In the prior art, a raised source/drain structure is formed by use of a selective epitaxial growth or SEG technique as shown in Fig. 1B.

The above-mentioned raised source/drain has a greatly potential structure. Nevertheless, it is rarely applied on production lines. The main reason is that the SEG technique has not been mature yet. In general, the SEG technique is performed by use of a chemical vapor deposition (CVD) process. However, the SEG technique is sensitive to the situations of the surfaces of processed wafers. For example, a cleaning process not exactly performed before an epitaxial growth process, or the poor conditions of the surfaces of the wafers after a plasma etching process may cause a loss of selectivity during the deposition process. Furthermore, the SEG process readily causes many defects on the boundary of the oxide layer of an epitaxial layer, thus creating a leakage current on the junction.

SUMMARY OF THE INVENTION

The object of the invention is to provide a method for manufacturing an MOS transistor having a raised source/drain structure. This method can resolve the problem created by the conventional SEG technique. In addition, this method has a simple process and is suitable for the deep micron process.

The another object of the invention is to provide a new MOS process which can attain the following objectives:

(1) form a raised source/drain structure to thereby obtain an extremely shallow junction and maintain a very low impedance of the source/drain;

(2) can be self-aligned;

(3) accomplish the local interconnect of a circuit; and (4) attain planarization.

In the invention, the raised source/drain structure is formed by a polysilicon layer and the self-alignment can be achieved by a planarization process. This method according to the invention can reduce the short channel effect and the series impedance of the source/drain. Meanwhile, the local interconnect of a circuit and the planarization can be achieved.

BRIEF DESCRIPTION OF THE DRAWINGS

The invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1A:
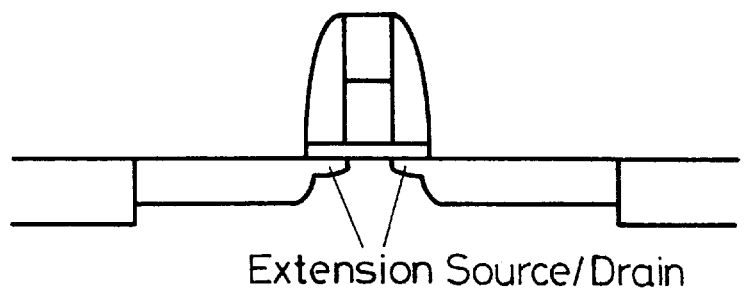
FIG. 1A is a schematic view showing an extension source/drain structure according to the prior art.
Figure 1B:
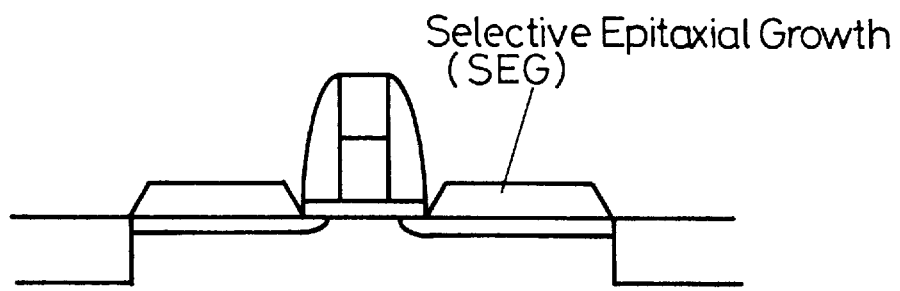
FIG. 1B is a schematic view showing a raised source/drain structure formed by use of a conventional SEG technique.
Figure 2A:
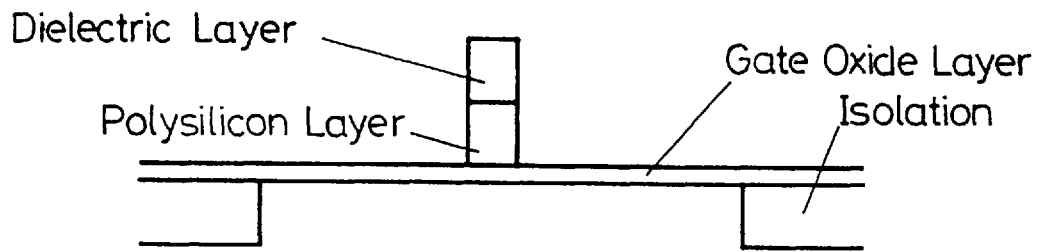
FIGS. 2A–2G are cross-sectional views showing a method for manufacturing an MOS transistor having a self-aligned and planarized raised source/drain structure according to an embodiment of the invention.

As shown in FIGS. 2A–2G, a raised source/drain structure which can overcome the problem caused in the conventional SEG technique is formed according to an embodiment of the invention. In FIG. 2A, A gate oxide layer, a polysilicon layer (about 100–200 nm thick) and a dielectric layer (about 100–200 nm thick) are formed in sequence on a substrate on which isolation layers are already formed. The dielectric layer can be a silicon oxide layer or silicon nitride layer. A gate region can be defined by plasma etching the dielectric layer and polysilicon layer in order.

Figure 2B:
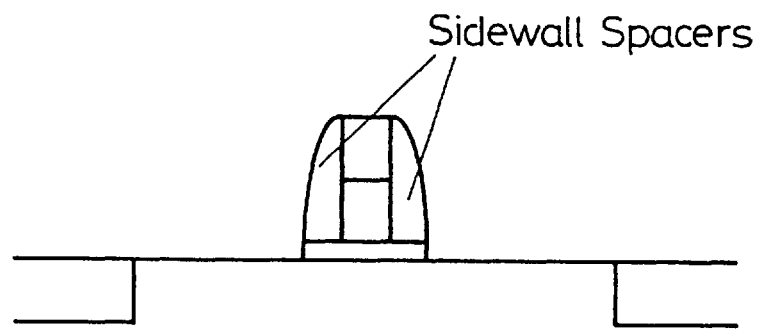

Referring to FIG. 2B, a dielectric layer (such as, a silicon oxide layer or silicon nitride layer) having a thickness of 50–200 nm is formed on the substrate and then sidewall spacers are formed on the two sides of the gate by use of a plasma etching process.

Figure 2C:
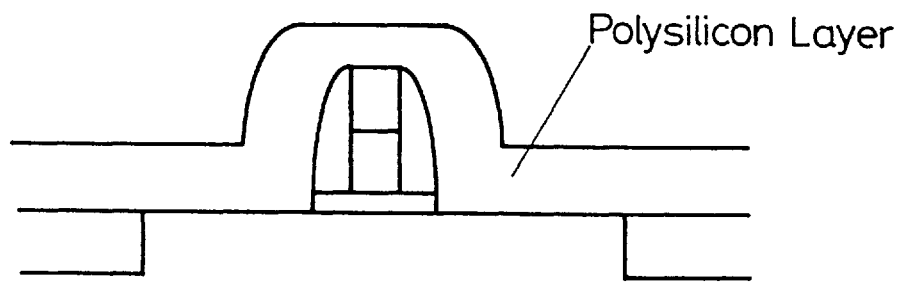

Referring to FIG. 2C, a second polysilicon layer having a thickness of 100–200 nm is deposited over the substrate. Moreover, the second polysilicon layer is doped by use of an in-situ doping process during the formation of the second polysilicon layer or by use of an ion implantation process after the formation of the second polysilicon layer.

Figure 2D:
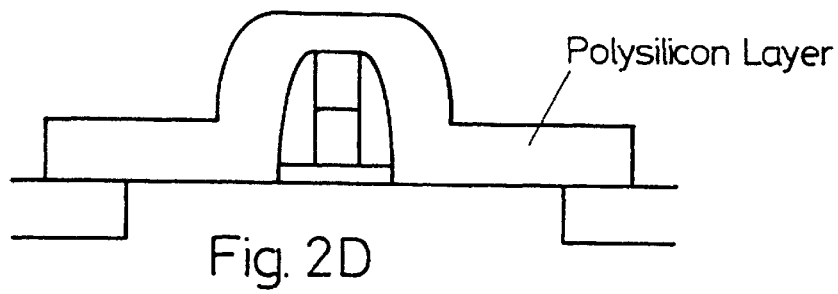

Referring to FIG. 2D, isolation and local interconnection are performed by plasma etching the second polysilicon layer.

Figure 2E:
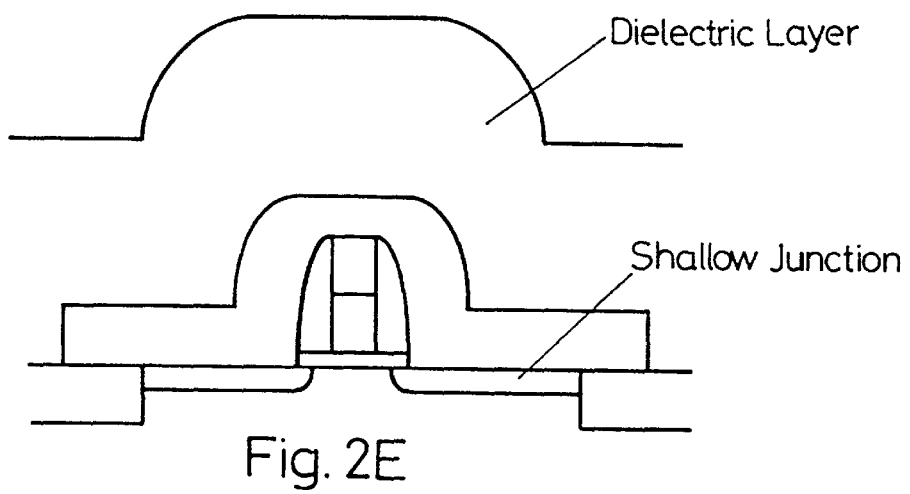

Referring to FIG. 2E, a dielectric layer (such as, a silicon oxide layer) having a thickness of 500–1,000 nm is deposited over the substrate. After that, the dopant inside the second polysilicon layer diffuses into the substrate by use of a high-temperature diffusion process, thereby forming the shallow junction of a source/drain.

Figure 2F:
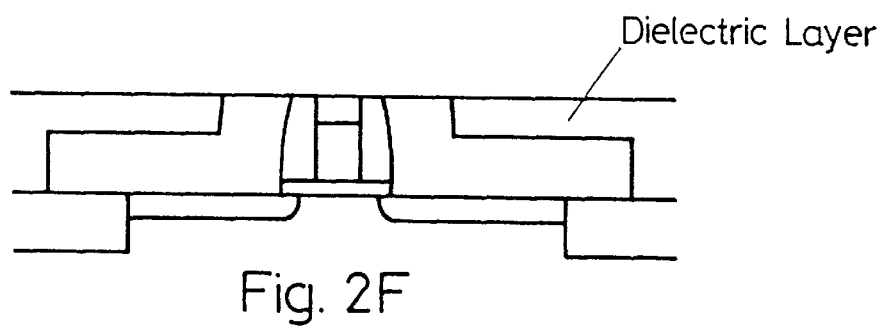

Referring to FIG. 2F, the surface of the dielectric layer is planarized by use of a chemical mechanical polishing (CMP) process. As can be known from FIG. 2F, the part of the second polysilicon layer on the gate is removed, so that the source region and drain region are isolated from each other.

Figure 2G:
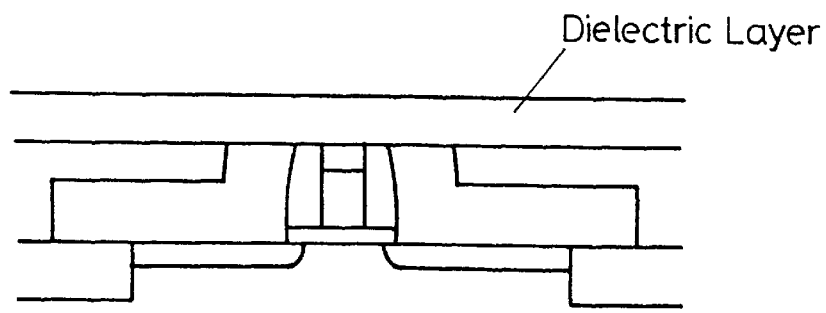

Referring to FIG. 2G, a dielectric layer (such as, a silicon oxide layer) having a thickness of 100–300 nm is deposited over the substrate. Then, subsequent contact windows and metal layers can be formed by use of a conventional technique.

What is claimed is:

1. A method for manufacturing a MOS transistor, comprising the sequential steps of:

forming a gate oxide layer, a gate layer, and a first dielectric layer in sequence on a substrate on which isolation layers are already formed;

etching said first dielectric layer and said gate layer in order to define a gate region;

forming sidewall spacers on opposing sides of said gate region;

forming a doped polysilicon layer overlying said isolation layers, said substrate, said sidewall spacers, and said gate region;

etching the portion of said polysilicon layer overlying said isolation layers to achieve isolation between adjacent devices, and to form local interconnections;

depositing a second dielectric layer;

performing an annealing process to diffuse the dopant inside said polysilicon layer into said substrate, thereby forming a doped junction;

performing a polishing process to remove the portion of said polysilicon layer overlying said gate region, thereby defining a completely isolated source region and drain region;

depositing a third dielectric; and forming contact windows and metal layers contacting said gate, source, and drain regions.

2. A method as claimed in claim 1, wherein said polysilicon layer is doped by use of an in-situ doping process or an ion implantation process.

3. A method as claimed in claim 1, wherein said polishing process is a CMP process.

4. A method as claimed in claim 2, wherein said polishing process is a CMP process.

* * * * *